United States Patent
Yeh et al.

(10) Patent No.: US 6,811,892 B2
(45) Date of Patent: Nov. 2, 2004

(54) LEAD-BASED SOLDER ALLOYS CONTAINING COPPER

(75) Inventors: Shing Yeh, Kokomo, IN (US); Bradley H. Carter, Kokomo, IN (US); Frank Stepniak, Noblesville, IN (US); Scott D. Brandenburg, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 22 days.

(21) Appl. No.: 10/226,370

(22) Filed: Aug. 22, 2002

(65) Prior Publication Data

US 2004/0035909 A1 Feb. 26, 2004

(51) Int. Cl.⁷ .................. B23K 35/26; B32B 15/01; B32B 15/20
(52) U.S. Cl. .................. 428/647; 428/620; 428/674; 228/262.9; 228/262.2
(58) Field of Search .................. 428/647, 620, 428/674; 228/262.9, 262.2

(56) References Cited

U.S. PATENT DOCUMENTS

| | | | | |
|---|---|---|---|---|
| 5,410,184 A | * | 4/1995 | Melton et al. | 257/772 |
| 5,487,868 A | * | 1/1996 | Nishimura | 420/559 |
| 5,607,099 A | * | 3/1997 | Yeh et al. | 228/180.22 |
| 5,803,340 A | * | 9/1998 | Yeh et al. | 228/56.3 |
| 5,914,535 A | * | 6/1999 | Brandenburg | 257/777 |
| 5,938,862 A | | 8/1999 | Yeh et al. | 148/400 |
| 6,221,514 B1 | * | 4/2001 | Hawes et al. | 428/646 |
| 6,251,501 B1 | * | 6/2001 | Higdon et al. | 428/209 |
| 6,281,106 B1 | | 8/2001 | Higdon et al. | 438/613 |
| 6,375,062 B1 | | 4/2002 | Higdon et al. | 228/214 |
| 6,570,260 B1 | * | 5/2003 | Yeh et al. | 257/778 |
| 6,589,594 B1 | * | 7/2003 | Hembree | 427/97 |
| 6,619,536 B2 | | 9/2003 | Yeh et al. | |
| 6,622,907 B2 | * | 9/2003 | Fanti et al. | 228/215 |
| 6,630,251 B1 | | 10/2003 | Carter et al. | |

FOREIGN PATENT DOCUMENTS

| | | | |
|---|---|---|---|
| EP | 0198353 | 6/2000 | |
| EP | 1009202 | 6/2000 | ............ H05K/3/34 |
| GB | 721881 | 1/1955 | |
| JP | 01233087 | 9/1989 | |
| JP | 11000791 | 1/1999 | |

OTHER PUBLICATIONS

Jong–Hyun Lee, Daejin Park, Jong–Tae Moon, Yong–Ho Lee, Dong Jyuk Shin, Yong–Seog Kim, "Reliability of Composite Solder Bumps Produced by an In–Situ Process", Journal of Electronic Maaterials, vol. 29, No. 10, 2000.

C.G. Kuo, S.M.L. Sastry, K.L. Jerina, "Tensile and Creep Properties of In–Situ Composite Solders", The Minerals, Metals & Materials Society, 1993.

\* cited by examiner

*Primary Examiner*—Deborah Jones
*Assistant Examiner*—Jason L Savage
(74) *Attorney, Agent, or Firm*—Stefan V. Chmielewski

(57) ABSTRACT

A tin-lead solder alloy containing copper and optionally silver as its alloying constituents. The solder alloy consists essentially of, by weight, about 55% to about 75% tin, about 11% to about 44% lead, up to about 4% silver, nickel, palladium, platinum and/or gold, greater than 1% to about 10% copper, and incidental impurities. The solder alloys contain a small portion of CuSn intermetallic compounds, and exhibit a melting mechanism in which all but the intermetallic compounds melt within a narrow temperature range, though the actual liquidus temperature of the alloys may be considerably higher, such that the alloys can be treated as requiring peak reflow temperatures of about 250° C. or less. The intermetallic compounds precipitate out to form a diffusion barrier that increases the reliability of solder connections formed therewith.

20 Claims, 7 Drawing Sheets

DP-305698

LEAD-BASED SOLDER ALLOYS CONTAINING COPPER

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to solder compositions of the type used with electronic packaging, such as flip chip packaging. More particularly, this invention relates to lead-based solder alloys requiring reflow temperatures that are compatible with typical circuit board assembly processes and exhibit improved reliability over eutectic 63Sn-37Pb and Sn-36Pb-2Ag solder alloys under high temperature processing and operating conditions.

(2) Description of the Related Art

Surface-mount (SM) semiconductor devices such as flip chips and ball grid arrays (BGA's) are attached to circuit boards with beadlike terminals formed on interconnect pads located on one surface of the device. The terminals are typically in the form of solder bumps near the edges of the chip, which are reflowed to both secure the chip to the circuit board and electrically interconnect the flip chip circuitry to a conductor pattern on the circuit board. Reflow soldering techniques typically entail depositing a controlled quantity of solder on the pads of the chip using methods such as electrodeposition and printing, and then heating the solder above its melting or liquidus temperature (for eutectic and noneutectic alloys, respectively) to form the solder bumps on the pads. After cooling to solidify the solder bumps, the chip is soldered to the conductor pattern by registering the solder bumps with their respective conductors and then reheating, or reflowing, the solder so as to form solder connections that metallurgically adhere to the conductors. The maximum temperature achieved during the reflow process is referred to as the peak reflow temperature; which is conventionally about 20° C. to about 50° C. above the melting or liquidus temperature of the particular solder alloy.

Flip chip interconnect pads are electrically interconnected with the circuitry on the flip chip through vias. Because aluminum metallization is typically used in the fabrication of integrated circuits, interconnect pads are typically aluminum or aluminum alloy, which are generally unsolderable and susceptible to corrosion if left exposed. Consequently, one or more additional metal layers are often deposited on the pads to promote wetting and metallurgical bonding with solder bump alloys. These additional metal layers, referred to as under bump metallurgy (UBM), may be, for example, sputtered nickel and copper, respectively, or an evaporated multilayer structure of chromium, a diffusion barrier layer of a chromium-copper alloy, and a solderable layer of copper. In each example, copper forms the outer layer of the UBM because it is readily solderable, i.e., can be wetted by and will metallurgically bond with solder alloys of the type used for solder bumps.

FIG. 1 represents a cross-section through a solder bump connection or joint 12 of a flip chip 10 attached to a circuit board 14, such as an organic circuit board known in the industry as FR-4, though the chip 10 could be mounted to a flexible circuit, ceramic or silicon substrate, or another suitable material. The solder joint 12 is bonded to an aluminum runner 16 on the chip 10 and a copper trace 18 on the board 14, thereby electrically and mechanically connecting the chip 10 to the board 14. As shown, a portion of the runner 16 is exposed by an opening in a passivation layer 22 to define an interconnect pad on which a UBM 20 has been deposited. The solder joint 12 has a spherical shape characteristic of a reflowed solder bump alloy, such as the eutectic 63Sn-37Pb solder alloy (melting point of 183.0° C.) and the eutectic 62Sn-36Pb-2Ag solder alloy (melting point of 178.8° C.) used for flip chip assemblies. The peak reflow temperature for the eutectic Sn-37Pb and Sn-36Pb-2Ag alloys is about 205° C. to about 240° C. Various other alloys are commercially available and used for flip chip assembly, including Pb-free alloys such as Sn-5Ag, eutectic Sn-3.5Ag and eutectic Sn-0.9Cu, and their derivatives including Sn-4.0Ag-0.5Cu, Sn-3.9Ag-0.6Cu, Sn-3.8Ag-0.7Cu, Sn-4Ag-1Cu and Sn-4.7Ag-1.7Cu. To be compatible with widely-used FR-4 circuit board assembly processes, the maximum reflow temperature of a solder alloy must not be higher than about 260° C., and preferably not higher than 250° C., in order to avoid damage to the circuit board and its components through board warping, pop-corning, delamination, etc. In view of these considerations, eutectic Sn-37Pb and Sn-36Pb-2Ag alloys have found wide use for reflow assembly processes, while eutectic Sn—Ag—Cu and near-eutectic Sn—Ag—Cu alloys have found use where lead-free solders are required.

In addition to having acceptable reflow characteristics, another consideration when selecting solder alloys for flip chip applications is reliability. In solder joints formed of lead-free SnAg and SnAgCu alloys, electromigration of UBM material in the direction of electron flux has been identified as leading to excessive resistances and open solder connections. When a thin-film UBM is used, such as a sputtered Al—NiV—Cu metallization or evaporated Cr—CrCu—Cu—Au metallization, this mass transport mechanism can become the predominant failure mechanism under severe service conditions, such as high temperature and/or current applications. In copending and co-assigned U.S. patent application Ser. No. 10/099,861, a noneutectic lead-free solder alloy containing tin, silver and copper is disclosed that inhibits UBM electromigration, and is therefore capable of exhibiting improved reliability over lead-free eutectic Sn—Ag—Cu solders, while maintaining a peak reflow temperature near that of the eutectic SnAg and eutectic SnAgCu alloys.

Lead-based solder alloys used in high temperature and high power applications also exhibit excessive resistances and open connections associated with several different diffusion-related mechanisms. It would be desirable if the reliability of lead-based solder alloys could be improved.

BRIEF SUMMARY OF THE INVENTION

The present invention is directed to a tin-lead solder alloy containing copper and optionally silver, nickel, palladium, platinum and/or gold as its alloying constituents. The solder alloy consists essentially of, by weight, about 55% to about 75% tin, about 11% to about 44% lead, up to about 4% silver, nickel, palladium, platinum and/or gold, greater than 0.5% (preferably greater than 1%) to about 10% copper, and incidental impurities. Because of the similar physical and chemical properties that copper and nickel exhibit in soldering applications, it is believed that nickel can be substituted in equal weight amounts for some or all of the copper in the solder alloy. An example of a SnPbCu alloy consists essentially of, by weight, about 60% to about 62% tin, about 34% to about 36% lead, about 2% to about 4% copper, and incidental impurities. An example of a SnPbAgCu alloy consists essentially of, by weight, about 56% to about 61% tin, about 32% to about 35% lead, about 2% to about 4% silver, about 2% to about 10% copper, and incidental impurities.

Certain solder alloys of this invention appear to be eutectic and therefore characterized by a true melting temperature, while others are noneutectic and therefore characterized by distinct solidus and liquidus temperatures. The noneutectic alloys have a solidus temperature near the melting temperatures of the eutectic alloys, and may have a liquidus temperature of up to about 470° C. However, the melting mechanism exhibited by the noneutectic alloys is such that they are substantially all melted and do not exhibit a "mushy zone" within a narrow temperature range, and therefore are said to have an "effective melting temperature" in which the alloys behave similarly to the eutectic alloys even though their actual liquidus temperatures are considerably higher. As a result, alloys of this invention containing up to 10 weight percent copper reflow at temperatures much lower than their actual liquidus temperatures, to the extent that these compositions can be treated as requiring peak reflow temperatures of about 250° C. or less.

In addition to their favorable reflow characteristics, copper is present in the solder alloys of this invention in amounts sufficient to precipitate out as CuSn intermetallic compounds (IMC's), which have been found to deposit at the interface between the solder and a UBM on which the solder is reflowed for flip chip and BGA applications. The IMC deposit advantageously increases the effective thickness of the UBM, thereby increasing the time required for a resistive or open solder connection to occur.

Other objects and advantages of this invention will be better appreciated from the following detailed description.

DETAILED DESCRIPTION OF THE INVENTION

Figure 1:
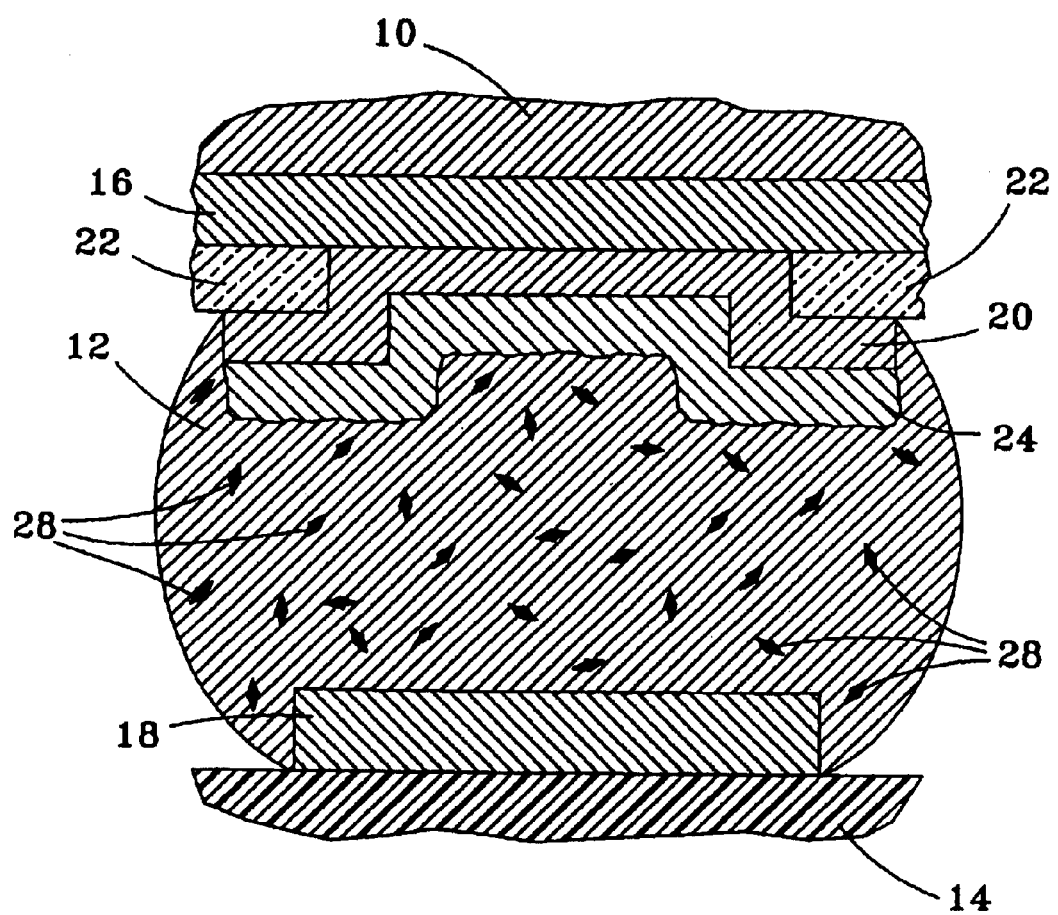
FIG. 1 represents a cross-sectional view of a solder bump connection of a flip chip formed in accordance with the present invention.

The invention is an improvement over the eutectic lead-containing 63Sn-37Pb and Sn-36Pb-2Ag solder alloys, modified to contain copper in an amount sufficient to form CuSn IMC's. In an application such as the flip chip solder joint connection represented in FIG. 1, these CuSn IMC's preferentially precipitate along the interface between the solder joint 12 and the UBM 20, as represented by the thin IMC layer 24 in FIG. 1. Lesser amounts of CuSn IMC's are observed in the bulk of the solder joint 12. The result is effectively a thicker composite UBM comprising the original UBM 20 and the IMC layer 24. The thicker composite UBM is capable of surviving longer than the UBM 20 alone when the solder joint 12 is subject to diffusion-related mechanisms associated with high temperature and/or current conditions, thus increasing the reliability of the joint 12.

The above benefits made possible with this invention are achieved with SnPb-based alloys having a composition of, by weight, about 55% to about 75% tin, about 11% to about 44% lead, up to about 4% silver, greater than 0.5% to about 10% copper, and incidental impurities. Nickel is believed to be a suitable substitute for some or all of the copper content in the alloy because of the similar physical and chemical properties that nickel exhibits in soldering applications. In addition, nickel, palladium, platinum and/or gold are believed to be suitable as substitute(s) for any silver content in the alloy.

Within the SnPbCu and SnPbCuAg compositions are two eutectic or near-eutectic compositions, Sn-36Pb-2Cu and Sn-35Pb-2Ag-2Cu, characterized by melting temperatures of about 183.0° C. and 178.3° C., respectively, and therefore the same or very near the melting temperatures of eutectic Sn-37Pb (183.0° C.) and Sn-36Pb-2Ag (178.8° C.). Other alloys within the above compositional ranges are noneutectic and therefore characterized by distinct solidus and liquidus temperatures. The noneutectic alloys have a solidus temperature near the melting temperatures of the eutectic alloys on which they are based, but have liquidus temperatures well in excess of the peak reflow temperature of 205° C. to 250° C. allowed for many reflow processes. Nonetheless, with the exception of their CuSn IMC's, noneutectic alloys of this invention containing as much as 10 weight percent copper have been demonstrated to melt within a very narrow temperature range near their solidus temperatures. With very careful examination of differential scanning calorimetry (DSC) data for these alloys, their actual liquidus temperatures have been identified as occurring at temperatures of up to about 470° C., depending on copper content. However, the amount and distribution of the CuSn IMC's allow the alloys of this invention to reflow within an "effective" melting range that permits the use of peak reflow temperatures of less than about 250° C., and even below 215° C., depending on alloy composition. As such, alloys of this invention can be reflowed at peak temperatures comparable to those of the eutectic Sn-37Pb and Sn-36Pb-2Ag alloys (about 205° C. to about 240° C.).

The melting mechanism of the solder alloys of this invention is attributable to the melting of a eutectic phase and the dissolution or melting of at least one of two IMC's, $Cu_6Sn_5$ or $Cu_3Sn$, which were determined to exist above the melting point of the eutectic 63Sn-37Pb and Sn-36Pb-2Ag alloys. However, for copper concentrations in the range of 1-10 weight percent, very limited amounts of IMC's exist, and their dissolution/melting in the alloys is not readily apparent unless the melting behavior of the alloy is very carefully examined. In any event, alloys of this invention containing up to 10 weight percent copper have been shown to reflow at temperatures much lower than their actual liquidus temperatures, to the extent that these compositions can be treated as eutectic compositions with very small amounts of $Cu_6Sn_5$ or $Cu_3Sn$ IMC particles suspended in the liquid solder during reflow.

The alloys of this invention contain a sufficient amount of copper above the eutectic level such that CuSn IMC's precipitate out to form the IMC layer 24 at the interface between the UBM 20 and solder joint 12 (FIG. 1), and to a lesser degree in the bulk of the solder joint 12. In this manner, the thickness of the UBM 20 is effectively increased with the copper-rich IMC layer 24, and the combination of the original UBM 20 and the precipitated IMC layer 24 extend the life of the solder joint 12 under severe current and temperature conditions. According to one theory, the CuSn IMC layer 24 acts as a diffusion barrier to electromigration of UBM material in the direction of electron flux. The IMC layer 24 also inhibits the conversion of a thin-film UBM 20 to intermetallic compounds (a mechanism referred to as "cap consumption"), while additional CuSn IMC in the bulk of the solder joint 12 is believed to increase resistance to electromigration through the solder joint 12, with the result of further increasing the time required for an excessively resistive or open connection to occur.

In a first investigation leading to this invention, HTS (high temperature storage) tests were performed to evaluate the eutectic Sn-37Pb alloy (as reference) and the Sn-37Pb alloy modified to contain sufficient copper to attain a copper level of about 2 weight percent (yielding a Sn-36Pb-2Cu alloy). The test employed non-underfilled 150×150 mils (about 3.81×3.81 mm) bi-polar power flip chips attached to a laminate circuit board with 18 mil (about 0.46 mm) pitch solder connections. The solder connections were formed by reflowing solder bumps formed on thin-film UBM's of sputtered Al—NiV—Cu. During the HTS test, the circuit board was maintained at a temperature of about 150° C. At intervals of about 250 hours, specimens of each type of solder alloy were removed from test and examined to determine the onset of UBM degradation associated with cap consumption. Cap consumption was determined by examining the fracture surface of a solder connection subjected to a die shear test. A ductile solder fracture is the normal fracture mode, whereas cap consumption damage was indicated if failure occurred by delamination at the interface between the UBM and the aluminum metallization on the flip chip.

Figure 2:
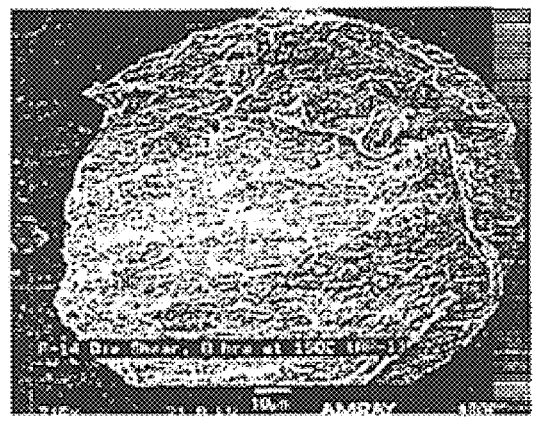
FIGS. 2 through 4 and 5 through 7 are scanned images of fracture surfaces of solder bumps formed of the eutectic 63Sn-37Pb alloy of the prior art and a 62Sn-36Pb-2Cu solder alloy of this invention, respectively.
Figure 3:
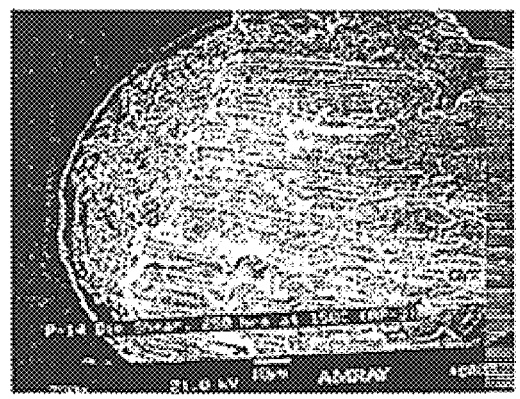
Figure 4:
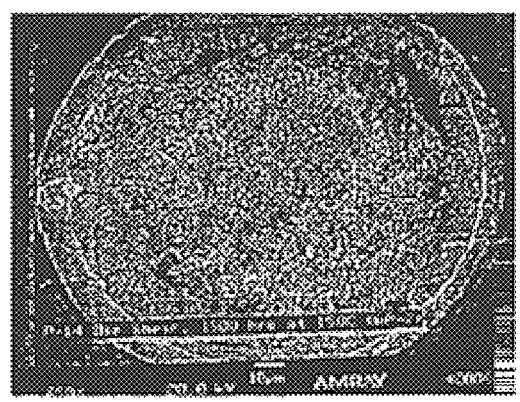
Figure 5:
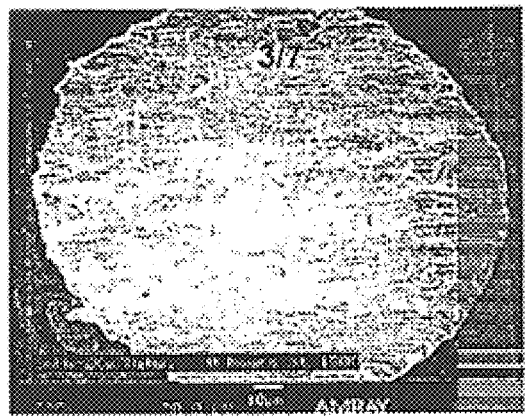
Figure 6:
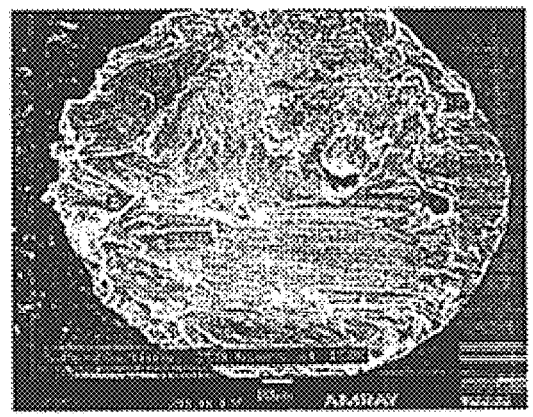
Figure 7:
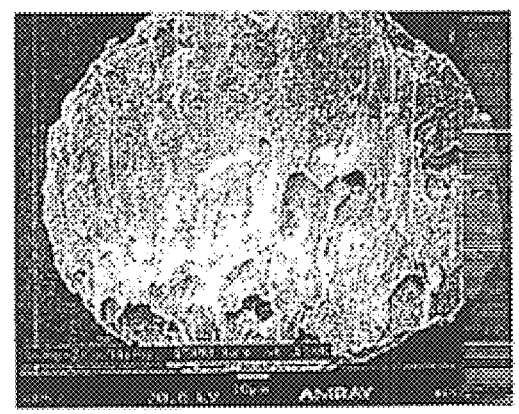

The onset of degradation for the baseline Sn-37Pb alloy was observed at the first 250-hour inspection. In contrast, the onset of degradation was not observed for the experimental Sn-36Pb-2Cu alloy after successfully completing 1500 hours of test, evidencing a relative reliability of greater than 6.0 compared to the Sn-37Pb baseline. Scanning electron microscope (SEM) photographs of the die shear bump fracture surfaces of some HTS specimens are shown in FIGS. 2 through 7. FIGS. 2 and 5 show the appearance of fracture surfaces of Sn-37Pb and Sn-36Pb-2Cu solder connections that had not undergone HTS testing, and are representative of a typical ductile fracture mode. FIGS. 3 and 4 show the appearance of fracture surfaces of Sn-37Pb solder connections that had undergone 250 and 1500 hours of HTS testing, respectively. In FIG. 3, cap consumption damage can be observed in the lefthand portion of the fracture surface. In FIG. 4, the entire cap has been consumed and fracture has occurred between an NiSn IMC layer and the unreacted aluminum metallization. FIGS. 6 and 7 are of fracture surfaces of Sn-36Pb-2Cu solder connections that had undergone 250 and 1500 hours of HTS testing, respectively, and show the typical ductile fracture mode, evidencing that cap consumption damage had not occurred.

Figure 8:
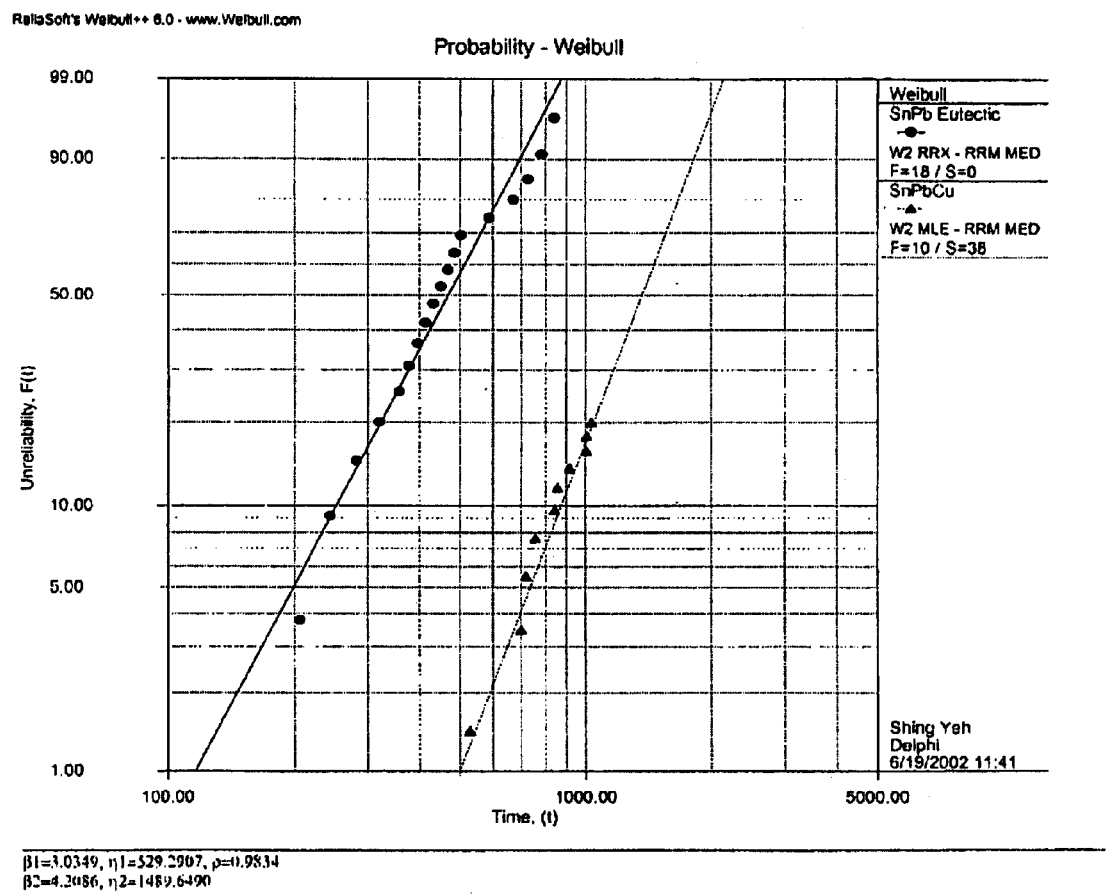
FIG. 8 is a Weibull plot comparing reliability data obtained with the eutectic 63Sn-37Pb alloy of the prior art and the 62Sn-36Pb-2Cu solder alloy of this invention.
Figure 9:
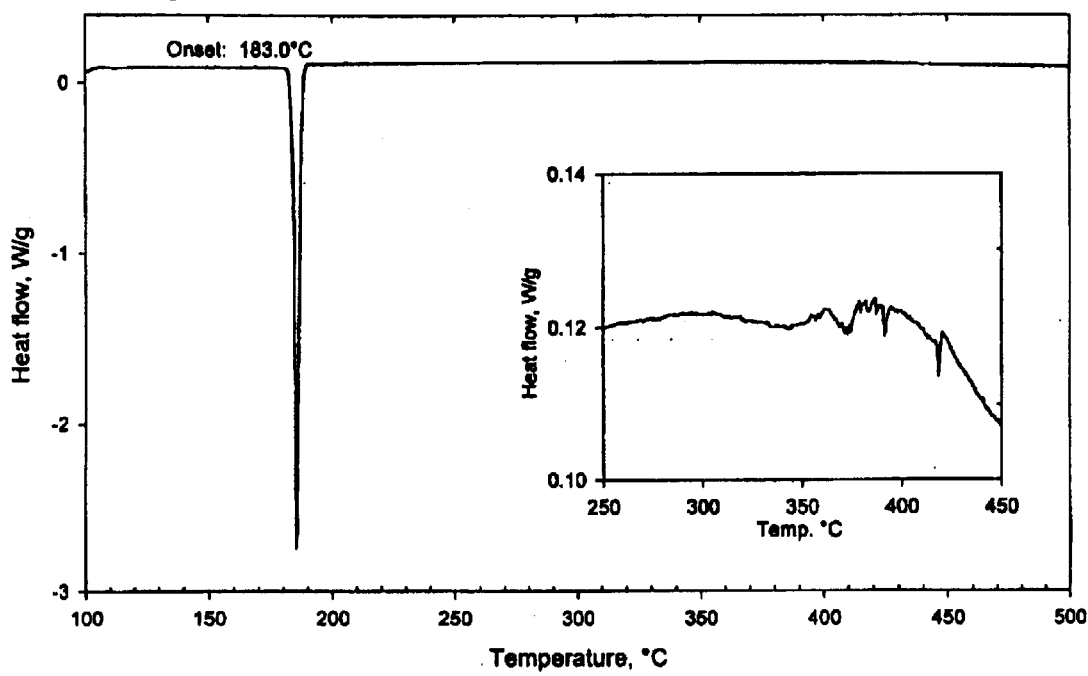
FIGS. 9 through 14 are plots taken from thermal analysis of various solder alloy compositions of this invention using differential scanning calorimetry.
Figure 10:
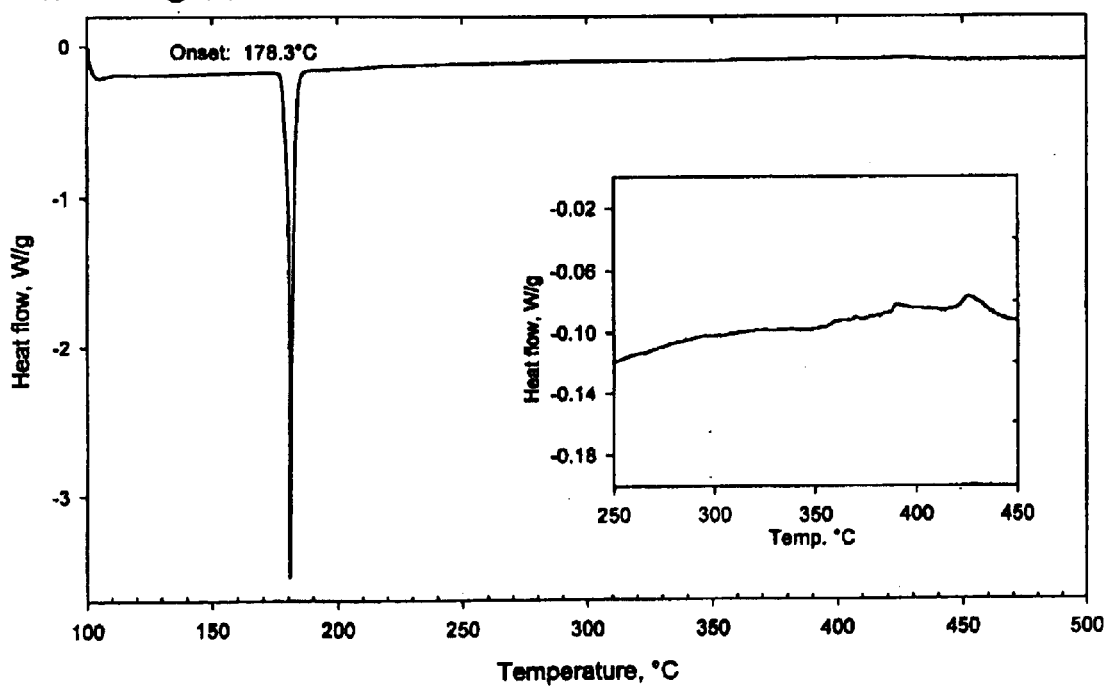
Figure 11:
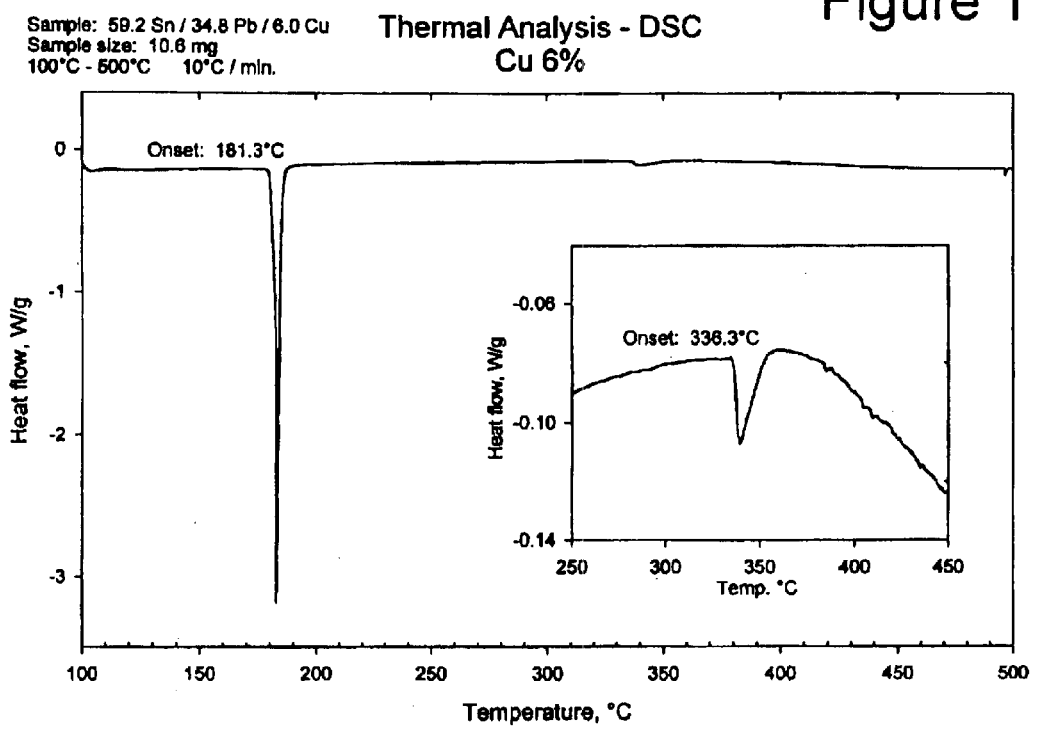
Figure 12:
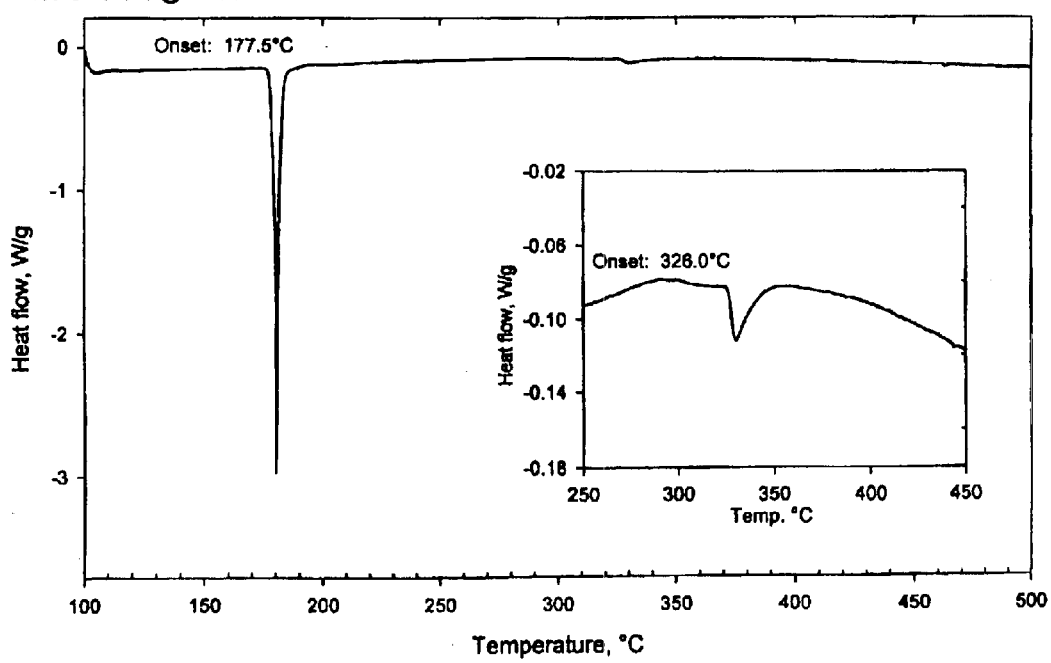
Figure 13:
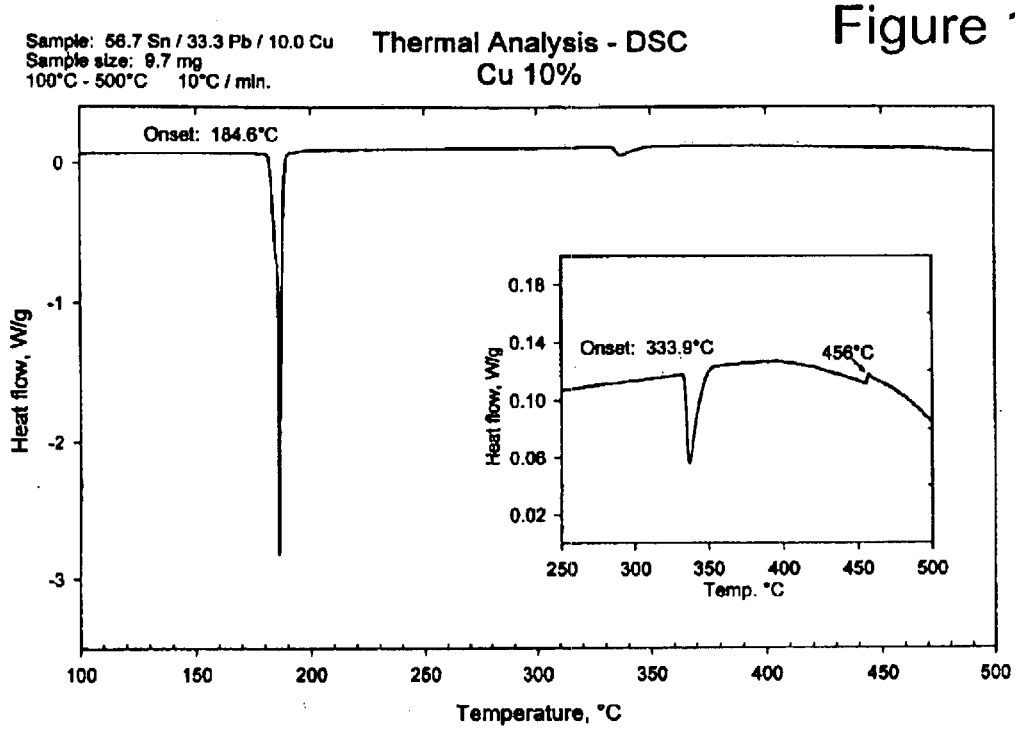
Figure 14:
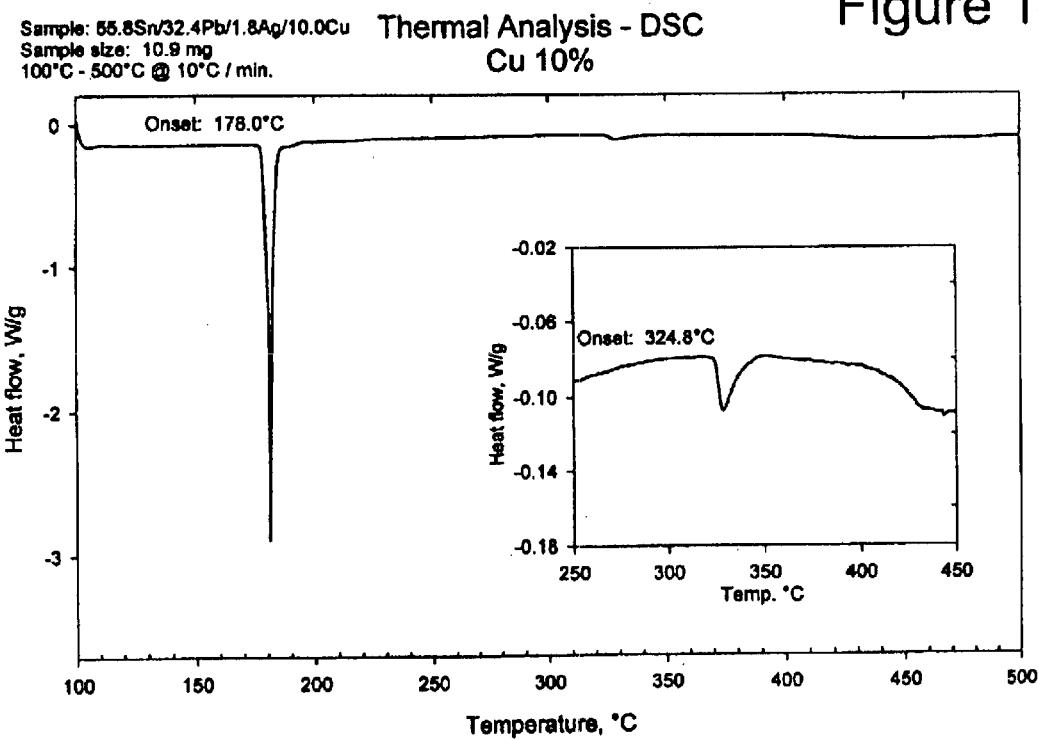

In a second investigation, HTOL (high temperature operational life) tests were performed to further evaluate the impact on flip chip bump reliability with the addition of about 2 weight percent copper to the eutectic Sn-37Pb alloy. As with the HTS test, the HTOL test employed 150×150 mils (about 3.81×3.81 mm) bi-polar power flip chips with 18 mil (about 0.46 mm) pitch solder connections. The chips were attached and underfilled on a laminate circuit board, and tested at current levels of about 600 mA per bump, an ambient temperature of about 145° C., and a junction temperature of about 150° C. The Weibull life for the test specimens is presented in FIG. 8, and show a Weibull life of about 529 hours for the baseline Sn-37Pb specimens, and about 1489 hours for the Sn-36Pb-2Cu specimens. The results correspond to a relative reliability of about 2.8 for the Sn-36Pb-2Cu specimens over the baseline Sn-37Pb specimens. From these data, it was concluded that the reliability of the eutectic Sn-37Pb alloy could be significantly improved with the addition of about 2 weight percent copper.

A reflow experiment was conducted with ingots of SnPbCu and SnPbAgCu alloys prepared by adding copper to the molten eutectic Sn-37Pb alloy and molten eutectic Sn-36Pb-2Ag alloy to attain copper levels of up to about 20 weight percent. The molten alloys were heated above about 500° C. for about 30 minutes to ensure complete alloying of all elements. Small pieces were then cut from the resulting ingots, placed on ceramic substrates, fluxed with a Type RMA flux, and then run through a reflow oven with a peak reflow temperature of either about 215° C. or about 250° C. The reflow profile used was typical for circuit assembly processes using the eutectic Sn-37Pb and Sn-36Pb-2Ag solder alloys.

At reflow temperatures of about 215° C., the baseline eutectic alloys and those alloys modified to contain up to 4 weight percent copper were observed to reflow completely, forming characteristic spherical solder balls, while alloys containing 6 weight percent copper or more did not fully reflow. At reflow temperatures of about 250° C., the baseline eutectic alloys and those alloys modified to contain up to 10 weight percent copper were observed to reflow completely, again forming characteristic spherical solder balls, while alloys containing 12 weight percent copper or more did not fully reflow. The solidus and liquidus temperatures of ingots containing up to about 10 weight percent copper were determined by DSC analysis, summarized in Table I below. Plots of the DSC analysis of six of the copper-containing specimens are shown in FIGS. 9 through 14.

TABLE I

| Alloy | Solidus (° C.) | Liquidus (° C.) |
|---|---|---|
| 63Sn—37Pb (baseline) | 183.0 | 183.0 |
| 62Sn—36Pb—2Cu | 183.0 | 183.0 |
| 61Sn—35Pb—4Cu | 180.6 | 337.1 |
| 59Sn—35Pb—6Cu | 181.3 | 336.3 |
| 58Sn—34Pb—8Cu | 182.0 | 456.0 |
| 57Sn—33Pb—10Cu | 184.6 | 470.0 |
| 62Sn—36Pb—2Ag (baseline) | 178.8 | 178.8 |
| 61Sn—35Pb—2Ag—2Cu | 178.3 | 178.3 |
| 60Sn—34Pb—2Ag—4Cu | 178.7 | 329.0 |
| 58Sn—34Pb—2Ag—6Cu | 177.5 | 326.0 |
| 57Sn—33Pb—2Ag—8Cu | 177.8 | 324.8 |
| 56Sn—32Pb—2Ag—10Cu | 178.0 | 324.8 |

All of the copper-containing alloys exhibited a very narrow melting range around either 183° C. or 179° C., which are the melting temperatures for the eutectic SnPb and SnPbAg alloys, respectively. With the addition of about 4 weight percent copper, a small peak appeared in the DSC curves at around 330° C. to 340° C. Small peaks observed with alloys containing about 6 weight percent copper can be seen in FIGS. 11 and 12. It was concluded that these peaks were from the melting of the CuSn IMC's in the bulk of the solder alloy. For copper additions of about 2 to 8 weight percent, the predominate pro-eutectic phase was $Cu_6Sn_5$, while $Cu_3Sn$ began to appear with copper additions above 8 weight percent, yielding a mixture of $Cu_6Sn_5$ and $Cu_3Sn$ as the pro-eutectic phase.

The above results are contrary to the conventional wisdom that the peak reflow temperature must be 20° C. to 50° C. above the liquidus temperature of the solder alloy. For example, the 61Sn-35Pb-4Cu alloy was determined by DSC analysis to have a liquidus temperature of 336.3° C., yet the sample of this alloy was found to reflow completely at 215° C. Similarly, the 56Sn-32Pb-2Ag-10Cu alloy was determined to have a liquidus temperature of 324.8° C., yet was found to reflow completely at 250° C. As evident from the DSC charts, only a trace amount of CuSn IMC's existed above the melting temperatures of the SnPb and SnPbAg eutectic compositions. The limited amounts of CuSn IMC's hindered quantitative DSC analysis. It was concluded that the small amounts of CuSn IMC's could explain why alloys containing up to 10 weight percent copper could be reflowed at temperatures far below their liquidus temperatures. For practical purposes, all of the copper-containing compositions tested could be treated as eutectic compositions with very small amounts of $Cu_6Sn_5$ or $Cu_3Sn$ IMC particles suspended in the liquid solder during reflow at a peak temperature between 205° C. and 250° C. In other words, molten bump characteristics such as wetting, surface tension, etc., are believed to be essentially unchanged under industry-standard reflow conditions.

Metallurgical analyses were then conducted on solder bumps formed of the eutectic Sn-37Pb alloy and the Sn-36Pb-2Cu alloy of this invention. The solder bumps were formed by depositing and then reflowing the alloys on chips having aluminum runners and thin-film (about two micrometers) NiV—Cu UBM, and then reflowing the solder bumps to attach the chips to a circuit board. The microstructure of the Sn-36Pb-2Cu alloy was found to have a eutectic SnPb matrix containing a pro-eutectic IMC phase predominantly of $Cu_6Sn_5$. The IMC phase was observed in the bulk solder as needle-like protrusions, and was also observed deposited along the interfaces between the solder and UBM and the solder and circuit board. The effective thickness of the UBM was about five micrometers, increased by about three micrometers due to the thickness of the deposited IMC phase. Greater increases in UBM thickness would be expected with higher levels of copper.

The reliability improvements observed with the copper-containing SnPb-based solder alloys of this invention are believed to be explained in view of the failure mechanisms associated with cap consumption and UBM electromigration. At high temperatures (e.g., HTS testing), inter-diffusion occurs at the UMB/solder interface, forming CuSn and NiSn IMC's. When a majority of the UBM is converted to IMC's, cap consumption-type failures occur. It was concluded that the additional CuSn IMC layer deposited by the copper-containing SnPb-based solder alloys of this invention acts as a diffusion barrier to tine at the surface of the UBM, slowing down the IMC conversion process and thereby increasing bump reliability/durability. Under high current and temperature conditions (e.g., HTOL testing), UBM materials migrate in the direction of electron flow away from the chip, until eventually the solder joint becomes excessively resistive. With their thicknesses effectively increased by the copper-containing alloys of this invention, a longer period of time at elevated current and temperature is necessary to deplete the UBM, thus making the solder joint connection more reliable. Based on diffusion theory, the reliability of a solder connection under both HTS and HTOL-type conditions would be expected to increase as a square of the UBM thickness increase. In the sample examined for metallurgical analysis, reliability could be expected to increase by a factor of six as a result of the effective UBM thickness increasing from about two to about five micrometers.

While the invention has been described in terms of a preferred embodiment, it is apparent that other forms could be adopted by one skilled in the art. Accordingly, the scope of the invention is to be limited only by the following claims.

What is claimed is:

1. A solder alloy consisting essentially of, by weight, about 55% to about 75% tin, about 11% to about 44% lead, up to about 4% silver, palladium, platinum and/or gold, an alloying constituent selected from the group consisting of:
   copper in an amount of at least 2% to about 10%;
   nickel in an amount of greater than 0.5% to about 10%; and
   a combination of both nickel and copper in an amount of greater than 0.5% to about 10%;
   and incidental impurities.

2. A solder alloy according to claim 1, wherein the alloying constituent is copper in an amount of about 4 to about 10 weight percent of the alloy, and the alloy requires a peak reflow temperature of not higher than 250° C.

3. A solder alloy according to claim 1, wherein the alloying constituent is copper in an amount of at least 2 to about 4 weight percent of the alloy, and the alloy requires a peak reflow temperature of not higher than 215° C.

4. A solder alloy according to claim 1, wherein the solder alloy consists of, by weight, about 60% to about 62% tin, about 34% to about 36% lead, at least 2% to about 10% copper, and incidental impurities.

5. A solder alloy according to claim 1, wherein the solder alloy consists of, by weight, about 56% to about 61% tin, about 32% to about 35% lead, about 2% silver, at least 2% to about 10% copper, and incidental impurities.

6. A solder alloy according to claim 1, wherein the alloying constituent is nickel in the amount of greater than 0.5 to about 10 weight percent.

7. A solder alloy according to claim 1, wherein the alloying constituent contains the combination of both nickel and copper in the amount of greater than 0.5 to about 10 weight percent.

8. A solder alloy according to claim 1, wherein the solder alloy is in the form of a solder bump on an interconnect pad of a surface-mount integrated circuit device, the solder bump having a diffusion barrier layer of CuSn intermetallic compound at an interface between the solder bump and the interconnect pad.

9. A solder bump formed of an alloy consisting of, by weight, about 60% to about 62% tin, about 34% to about 36% lead, an alloying constituent selected from the group consisting of:
   copper in an amount of at least 2% to about 10%;
   nickel in an amount of greater than 0.5% to about 10%; and
   a combination of both nickel and copper in an amount of greater than 0.5% to about 10%;
   and incidental impurities, the alloy having a peak reflow temperature of not higher than 250° C.

10. A solder bump according to claim 9, wherein the copper content is at least about 4 weight percent of the alloy, and the alloy requires a peak reflow temperature of not higher than 215° C.

11. A solder bump according to claim 9, wherein the alloy contains greater than 0.5 weight percent nickel.

12. A solder bump according to claim 9, wherein the solder bump is on a surface-mount integrated circuit device.

13. A solder bump according to claim 12, wherein the solder bump is on an interconnect pad of the device, the solder bump having a diffusion barrier layer of CuSn intermetallic compound at an interface between the solder bump and the interconnect pad.

14. A solder bump according to claim 13, wherein the solder bump is in the form of a solder joint attaching the device to a laminate or ceramic substrate.

15. A solder bump formed of an alloy consisting of, by weight, about 56% to about 61% tin, about 32% to about 35% lead, about 2% to about 4% silver, an alloying constituent selected from the group consisting of:
   copper in an amount of at least 2% to about 10%;
   nickel in an amount of greater than 0.5% to about 10%; and
   a combination of both nickel and copper in an amount of greater than 0.5% to about 10%;
and incidental impurities, the alloy having a peak reflow temperature of not higher than 250° C.

16. A solder bump according to claim 15, wherein the copper content is at least about 4 weight percent of the alloy.

17. A solder bump according to claim 15, wherein the alloy contains greater than 0.5 weight percent nickel.

18. A solder bump according to claim 15, wherein the solder bump is on a surface-mount integrated circuit device.

19. A solder bump according to claim 18, wherein the solder bump is on an interconnect pad of the device, the solder bump having a diffusion barrier layer of CuSn intermetallic compound at an interface between the solder bump and the interconnect pad.

20. A solder bump according to claim 19, wherein the solder bump is in the form of a solder joint attaching the device to a laminate or ceramic substrate.

* * * * *